(12) United States Patent
Hamamoto et al.

(10) Patent No.: US 11,545,978 B2
(45) Date of Patent: Jan. 3, 2023

(54) CONTROL DEVICE

(71) Applicant: Hitachi, Ltd., Tokyo (JP)

(72) Inventors: Goro Hamamoto, Tokyo (JP);
Tatsuyuki Ootani, Tokyo (JP); Yutaka Uematsu, Tokyo (JP); Jouji Matsushita, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 17/510,501

(22) Filed: Oct. 26, 2021

(65) Prior Publication Data

US 2022/0182057 A1    Jun. 9, 2022

(30) Foreign Application Priority Data

Dec. 3, 2020   (JP) .............................. JP2020-201143

(51) Int. Cl.
| | |
|---|---|
| *G06F 13/40* | (2006.01) |
| *H03K 19/0175* | (2006.01) |
| *H03K 19/00* | (2006.01) |
| *H03K 19/17784* | (2020.01) |
| *H03K 19/09* | (2006.01) |

(52) U.S. Cl.
CPC ... *H03K 19/017545* (2013.01); *G06F 13/409* (2013.01); *G06F 13/4068* (2013.01); *H03K 19/0005* (2013.01); *H03K 19/09* (2013.01); *H03K 19/17784* (2013.01)

(58) Field of Classification Search
CPC .............. G06F 13/4068; G06F 13/409; H03K 19/0005; H03K 19/017545; H03K 19/09; H03K 19/17784
See application file for complete search history.

(56) References Cited

U.S. PATENT DOCUMENTS

| | | | | |
|---|---|---|---|---|
| 4,744,076 A | * | 5/1988 | Elias | H04L 12/40 333/32 |
| 5,334,962 A | * | 8/1994 | Higgins | G11C 11/4097 257/728 |
| 5,568,063 A | * | 10/1996 | Takekuma | H04L 25/0298 326/86 |
| 5,729,154 A | * | 3/1998 | Taguchi | H03K 19/00384 326/86 |
| 6,067,594 A | * | 5/2000 | Perino | H05K 1/0246 326/86 |
| 7,961,003 B2 | * | 6/2011 | Wilson | G06F 13/4086 333/124 |
| 2014/0177739 A1 | | 6/2014 | Matsudaira et al. | |
| 2018/0260353 A1 | * | 9/2018 | de Haas | H04L 12/40032 |
| 2021/0407565 A1 | * | 12/2021 | Contreras | G11C 7/1084 |
| 2022/0294671 A1 | * | 9/2022 | Terao | H03M 1/126 |

FOREIGN PATENT DOCUMENTS

JP    2014-127809 A    7/2014

* cited by examiner

*Primary Examiner* — Kurtis R Bahr
(74) *Attorney, Agent, or Firm* — Mattingly & Malur, PC

(57) ABSTRACT

Main wiring including a plurality of differential transmission lines for transmitting differential signals is formed on a motherboard. Termination resistors, provided at both ends of each of the plurality of differential transmission lines, connect the plurality of differential transmission lines to each other. A plurality of daughter boards are connected in parallel to each other via the main wiring. A line characteristic impedance of each differential transmission line is higher than a termination resistance value, which is a resistance value of the termination resistor.

10 Claims, 6 Drawing Sheets

CONTROL DEVICE

CROSS-REFERENCE TO RELATED APPLICATION

The present application claims priority from Japanese application JP2020-201143, filed on Dec. 3, 2020, the contents of which is hereby incorporated by reference into this application.

BACKGROUND OF THE INVENTION

1. Field of the Invention

The present disclosure relates to a control device.

2. Description of the Related Art

Industrial control devices typically have a plurality of control boards mounted, and signal communication is performed between the control boards. The differential transmission system is more preferred than the single-ended transmission system for obtaining high noise resistance for signal communication while achieving signal communication between control boards at a high data rate of, for example, 80 Mbps or more. Communication systems for communicably connecting a plurality of control boards with the use of the differential transmission system include a multi low voltage differential signaling (MLVDS) system.

In the MLVDS system, for suppressing waveform distortions of differential signals, connecting each control board directly to main wiring without interposing any stub is recommended such that a plurality of control boards have a daisy chain structure. Thus, the main wiring is drawn into the control boards, and the main wiring is branched into wiring connected to communication nodes and wiring led out to the outside of the control boards within several mm in the vicinity of the communication nodes in the control boards. In addition, matching the differential characteristic impedance of the main wiring and the termination resistor with each other is recommended for suppressing waveform distortions of signals. Specifically, it is recommended to adjust both the differential characteristic impedance and the termination resistor to 100Ω.

At the same time, for industrial control devices, hot plug is desired in which the control board is replaced while continuing the operation at the time of maintenance, failure, or the like.

The MLVDS system mentioned above has, however, the problem of failing to perform hot plug in replacing the control boards, because the control boards are directly connected to the main wiring without interposing the stub. It is to be noted that even in the case where hot plug is not required, the insertion of a dummy control board or the like is required for allowing signal communication between other control boards when the control board is removed, which takes time and effort.

In contrast, JP 2014-127809 A discloses a transmission device in which receivers, which are control boards capable of communication in accordance with the MLVDS system, are connected in parallel to each other via main wiring. This transmission device includes two transmission lines for transmitting differential signals as main wiring and a plurality of control boards with two input/output terminals connected to the two transmission lines. Thus, hot plug is possible for the control boards.

SUMMARY OF THE INVENTION

When hot plug is performed in the transmission device described in JP 2014-127809 A, however, wiring from a communication node (specifically, a pin of an integrated circuit (IC) chip constituting a communication node) to the main wiring serves as a stub, thereby generating a waveform distortion referred to as ringing or a shelf in a differential signal. When the shelf is generated within the threshold voltage range, the long waveform stay time for which the differential signal stays within the threshold voltage range has the possibility of failing to secure the timing margin (minimum setup and hold time) of the eye mask. In addition, if the number of control boards is increased, the load (in particular, capacitive load) of a communication node of each control board blunts the (rising time)/(falling time) of a signal waveform, thereby narrowing the eye pattern.

Further, as described in JP 2014-127809 A, the MLVDS system includes Type 1 with a threshold voltage range from −50 mV to 50 mV and Type 2 with a threshold voltage range of 50 mV to 150 mV. In Type 2, the threshold voltage range has an offset of +100 mV, and a low-level signal will be thus output in the idle interval, thereby allowing malfunction to be suppressed. The threshold voltage range has, however, an offset, thus modulating the duty ratio of the signal, and increasing the DCD (Duty Cycle Distortion) jitter. Thus, as compared with Type 1 in which the threshold voltage range is symmetrical with respect to 0 V, the reduced waveform stay time for which the differential signal stays within the threshold voltage range is required particularly for increasing the speed. Accordingly, particularly in Type 2, there is a need to suppress the generation of a shelf within the threshold voltage range.

An object of the present disclosure is to provide a control device that makes it possible to suppress the generation of signal waveform distortions within a threshold voltage range while allowing hot plug.

A control device according to one aspect of the present disclosure includes: a master board with a main wiring formed to include a plurality of differential transmission lines for transmitting differential signals; termination resistors provided at both ends of each of the plurality of differential transmission lines to connect the plurality of differential transmission lines to each other; and a plurality of control boards connected in parallel to each other via the main wiring, and a characteristic impedance of each differential transmission line is higher than a termination resistance value that is a resistance value of the termination resistor.

The present invention makes it possible to suppress the generation of signal waveform distortions within a threshold voltage range while allowing hot plug.

DESCRIPTION OF THE PREFERRED EMBODIMENTS

Hereinafter, embodiments of the present disclosure will be described with reference to the drawings.

Figure 1:
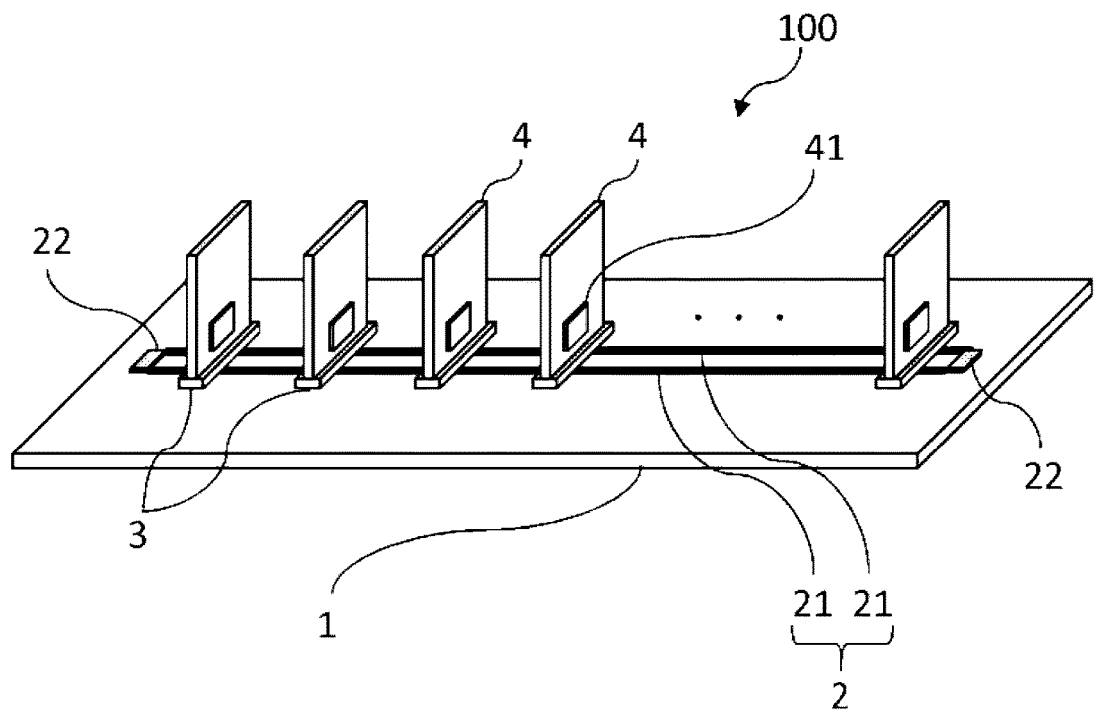
FIG. 1 is a perspective view schematically illustrating a configuration of a control device according to an embodiment of the present disclosure.

FIG. 1 is a perspective view schematically illustrating a configuration of a control device according to an embodiment of the present disclosure. The control device 100 illustrated in FIG. 1 includes a motherboard 1 which is a master board, main wiring 2 formed on the motherboard 1, a plurality of connectors 3 provided on the motherboard 1, and a plurality of daughter boards 4 which can be inserted into and removed from the connectors 3.

The main wiring 2 includes a plurality of (in the present embodiment, two) differential transmission lines 21 for transmitting differential signals. Termination resistors 22 that connect the differential transmission lines 21 to each other are provided at both ends of each differential transmission line 21.

The connector 3 serves as a connection for connecting the motherboard 1 and the daughter board 4 to each other. The plurality of connectors 3 are connected in parallel to each other via the main wiring 2. It is to be noted that each connector 3 is connected to both of the two differential transmission lines 21 included in the main wiring 2. In addition, the number of connectors 3 is not limited as long as there is more than one connector 3.

The daughter board 4, which serves as a control board (slave board) that can be inserted into and removed from the connector 3, is connected to the main wiring 2 via the connector 3 when the daughter board 4 is inserted into the connector 3. Thus, the plurality of daughter boards 4 will be connected in parallel to each other via the main wiring 2. The daughter board 4 includes an MLVDS device 41 that serves as a communication unit that performs communication with the other daughter boards 4 via the main wiring 2 in accordance with a MLVDS system. The MLVDS device 41 includes, for example, an IC chip. It is to be noted that the MLVDS system has multiple types that differ in threshold voltage range as described above, but unless otherwise specified, Type 2 with the threshold voltage range from 50 mV to 150 mV is considered herein.

Figure 2:
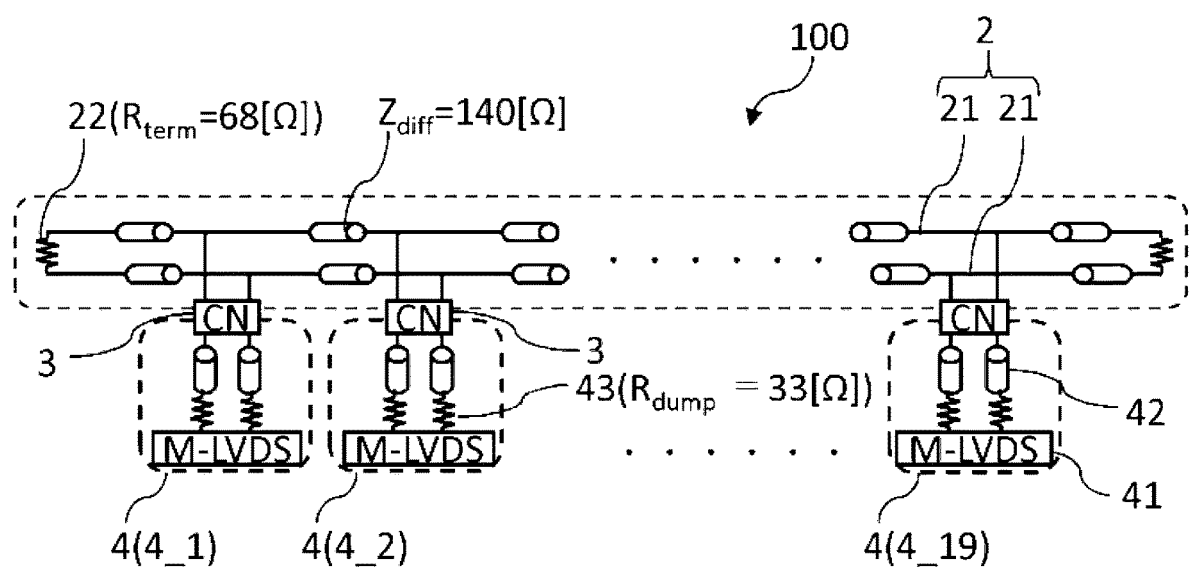
FIG. 2 is a diagram illustrating an example of a circuit topology of a control device according to an embodiment of the present disclosure.

FIG. 2 is a diagram illustrating an example of a circuit topology of the control device 100. In FIG. 2, the main wiring 2 includes the two differential transmission lines 21 as described above, and the terminals thereof are connected to each other via the termination resistors 22. Each differential transmission line 21 is about 400 mm in the present embodiment.

The plurality of connectors (in FIG. 2, denoted by CN) 3 are connected in parallel to each other via the two differential transmission lines 21. The example of FIG. 2 has nineteen connectors 3, and the daughter board 4 is inserted into each of the nineteen connectors 3. It is not necessary, however, to insert the daughter board 4 into all of the connectors 3. In the present embodiment, the nineteen daughter boards 4 may be distinguished and referred to as daughter boards 4_1 to 4_19 in order from the left in the drawing.

The daughter board 4 includes an MLVDS device 41, an internal transmission line 42, and a damping resistor 43. The MLVDS device 41 is connected to the connector 3 via the internal transmission line 42. The damping resistor 43 is provided on the internal transmission line 42. The length of the internal transmission line 42 is about 40 mm in the present embodiment. In addition, the length of the internal transmission line 42 is considered substantially equal to the length of the stub.

The line characteristic impedance $Z_{diff}$, which is the characteristic impedance of the differential transmission line 21, and the termination resistance value $R_{term}$, which is the resistance value of the termination resistor 22, are configured not to match each other. More specifically, the line characteristic impedance $Z_{diff}$ and the termination resistance value $R_{term}$ are different from each other. Specifically, the line characteristic impedance $Z_{diff}$ is higher than the termination resistance value $R_{term}$. In addition, the line characteristic impedance $Z_{diff}$ is desirably higher than 100Ω, and the termination resistance value $R_{term}$ is desirably lower than 100Ω. In the example of FIG. 2, the line characteristic impedance $Z_{diff}$ is 140Ω, and the termination resistance value $R_{term}$ is 68Ω.

In addition, the damping resistance value $R_{dump}$, which is the resistance value of the damping resistor 43, is desirably lower than ½ of the line characteristic impedance $Z_{diff}$. In the example of FIG. 2, the damping resistance value $R_{dump}$ is set to 33Ω. It is to be noted that the line characteristic impedance $Z_{diff}$ and the termination resistance value $R_{term}$ are not matched, which has the possibility of generating a distortion in the signal waveform. However, in the case where a stub is present as in the present embodiment, the distortion will be dominant in the signal waveform provided by the stub, and the distortion of the signal waveform is attenuated by the damping resistor 43, thus causing no problem.

In the control device 100, a generated voltage value (generation position) V, which is a voltage value at which a waveform distortion referred to as a shelf is generated in the differential signal, is expressed by the following relational expression (1):

$$V = V_0 \times (Z_{diff}) / (R_0 + R_{dump} + Z_{diff}) \tag{1}$$

where $V_0$ represents the voltage value of the driving power supply of the control device 100, and $R_0$ represents the output resistance of the MLVDS device 41. As shown by the relational expression (1), for increasing the generated voltage value of the shelf and then positioning the generated voltage value of the shelf outside the threshold voltage range, it is effective to increase the line characteristic impedance $Z_{diff}$ and reduce the damping resistance value $R_{dump}$ as much as possible. It is to be noted that in the relational expression (1), no termination resistor is assumed to be present for simplification. In the case where the termination resistor is present, the generated voltage value fails to be expressed by a simple expression such as the relational expression (1), but the basic tendency is similar to that in the case where the termination resistor is not present.

Assuming $V_0$=3.3 V, $Z_{diff}$=100Ω, $R_0$=50Ω, and $R_{dump}$=$Z_{diff}$/2=50Ω as an example of a signal without any termination resistor for simplification, the generated voltage value V is 3.3×0.5=1.65 V, and around the intermediate potential of the amplitude, that is, at the differential voltage, a shelf is generated in the vicinity of the threshold voltage range.

In contrast, with $V_0$=3.3 V, $Z_{diff}$=140Ω, $R_0$=50Ω, and $R_{dump}$=33Ω, the generated voltage value V is 3.3×0.63=2.07 V, which is higher than $V_0$/2. Thus, the generated voltage of the shelf can be made higher than around $V_0$/2, and the shelf can be kept from being generated within the threshold voltage range.

Figure 3:
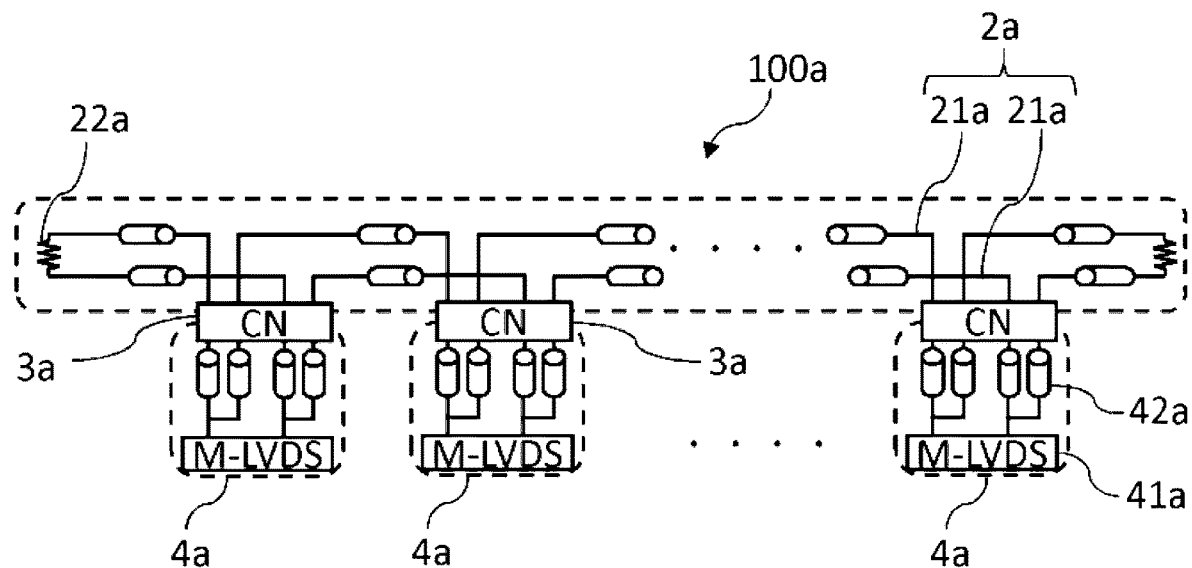
FIG. 3 is a diagram illustrating a circuit topology of a control device according to a first comparative example.

FIG. 3 is a diagram illustrating a circuit topology of a control device according to a first comparative example relative to the present embodiment. In FIG. 3, configurations corresponding to the configurations according to the present embodiment illustrated in FIGS. 1 and 2 are denoted with "a" added to the reference numerals. For example, a configuration corresponding to the MLVDS device 41 is referred to as an MLVDS device 41a.

The control device 100a illustrated in FIG. 3 has a circuit topology in which stubs are suppressed. More specifically, in the control device 100a, main wiring 2a is drawn into daughter boards 4a, and is branched into wiring connected to MLVDS devices 41a and wiring returned to the outside of the daughter boards 4a within several mm in the vicinity of the MLVDS devices 41a. More specifically, the main wiring 2a serves as both lead-in wiring and lead-out wiring with respect to the daughter boards 4a, and hot plug is not possible for the daughter boards 4a.

Figure 4:
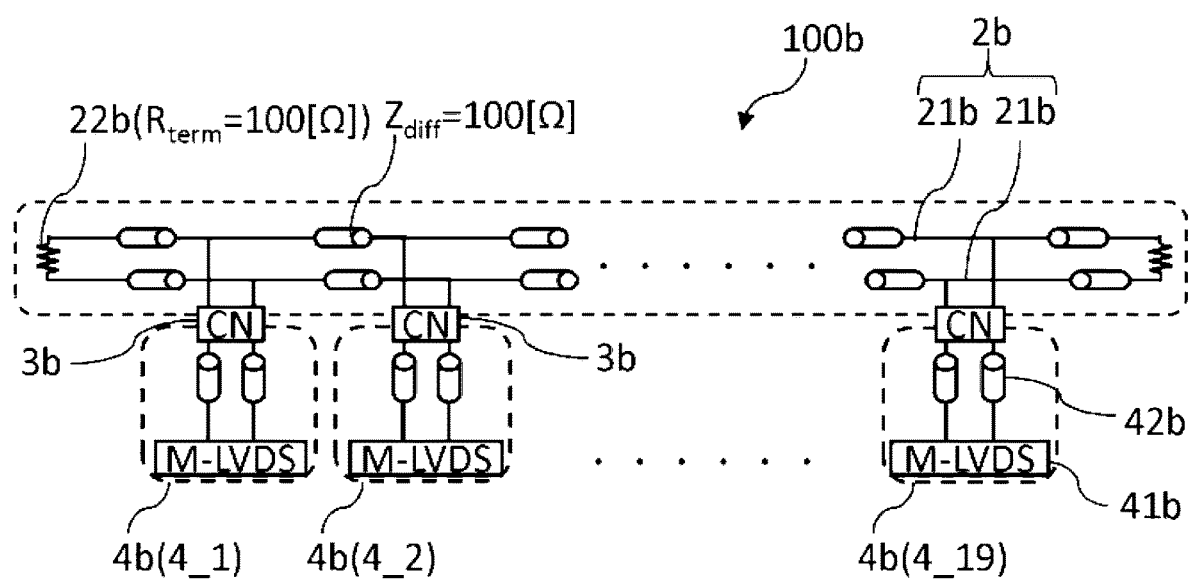
FIG. 4 is a diagram illustrating a circuit topology of a control device according to a second comparative example.

FIG. 4 is a diagram illustrating a circuit topology of a control device according to a second comparative example relative to the present embodiment. In FIG. 4, configurations corresponding to the configurations according to the present embodiment illustrated in FIGS. 1 and 2 are denoted with "b" added to the reference numerals. For example, a configuration corresponding to the MLVDS device 41 is referred to as an MLVDS device 41b.

In the control device 100b illustrated in FIG. 4, daughter boards 4b are connected in parallel to main wiring 2b similarly to the control device 100 according to the present embodiment. Thus, hot plug can be performed. In the control device 100b, however, the termination resistance value $R_{term}$ and the line characteristic impedance $Z_{diff}$ are matched with each other at 100Ω as in the conventional case. In addition, the daughter board 4b has therein no resistor corresponding to the damping resistor 43.

Figure 5:
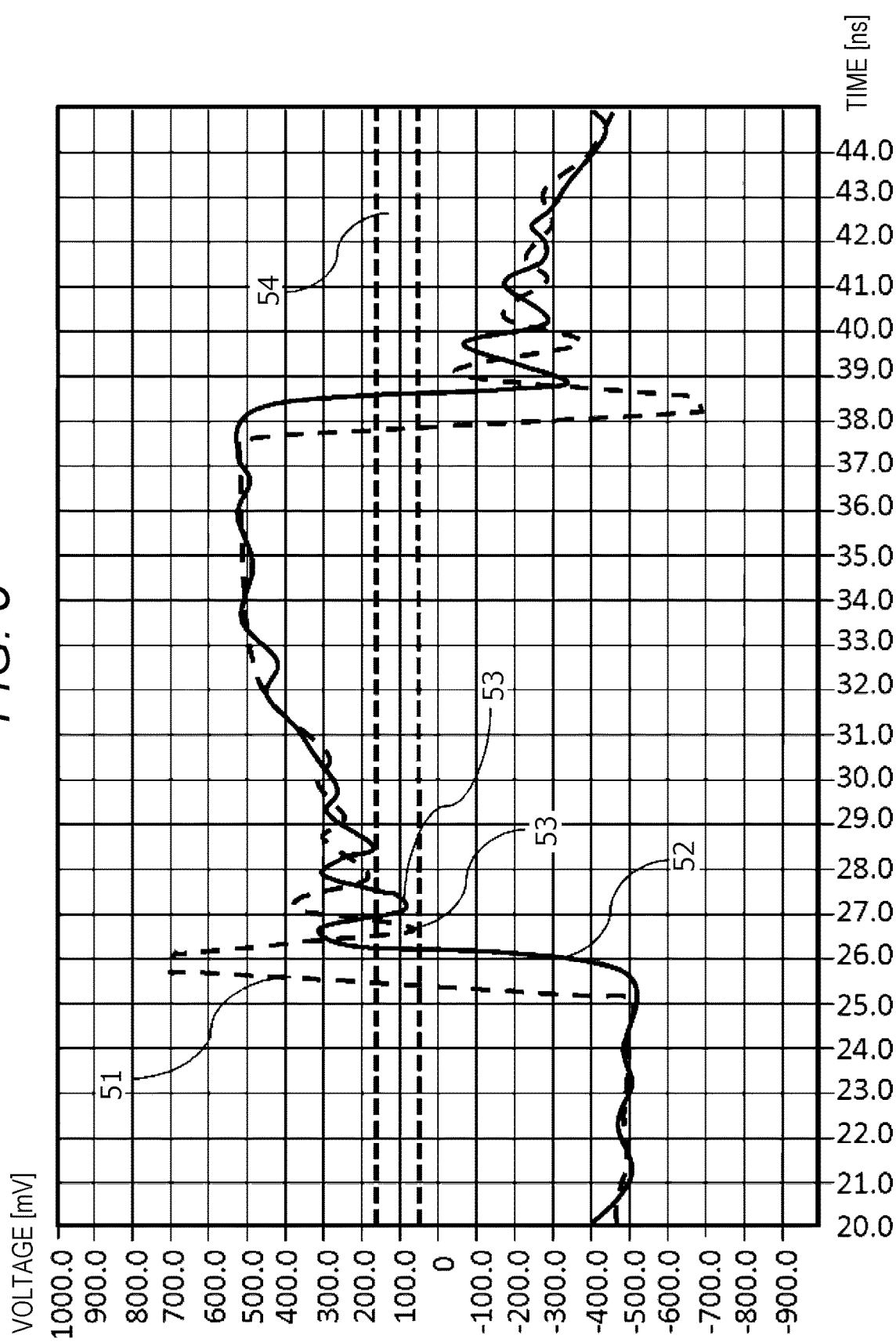
FIG. 5 is a diagram showing an example of a signal waveform in the control device according to the second comparative example.

FIG. 5 is a diagram showing an example of a signal waveform in the control device 100b according to the second comparative example illustrated in FIG. 4. FIG. 5 shows a transmitted signal waveform 51 and a received signal waveform 52 in the case of transmitting a signal from the sixth daughter board 4b_6 to the seventh daughter board 4b_7. As shown in FIG. 5, ringing is generated in both the transmitted signal waveform 51 and the received signal waveform 52 due to the influence of the reflection of the signal from each daughter board 4b, and shelves 53 enter a threshold voltage range 54.

Figure 6:
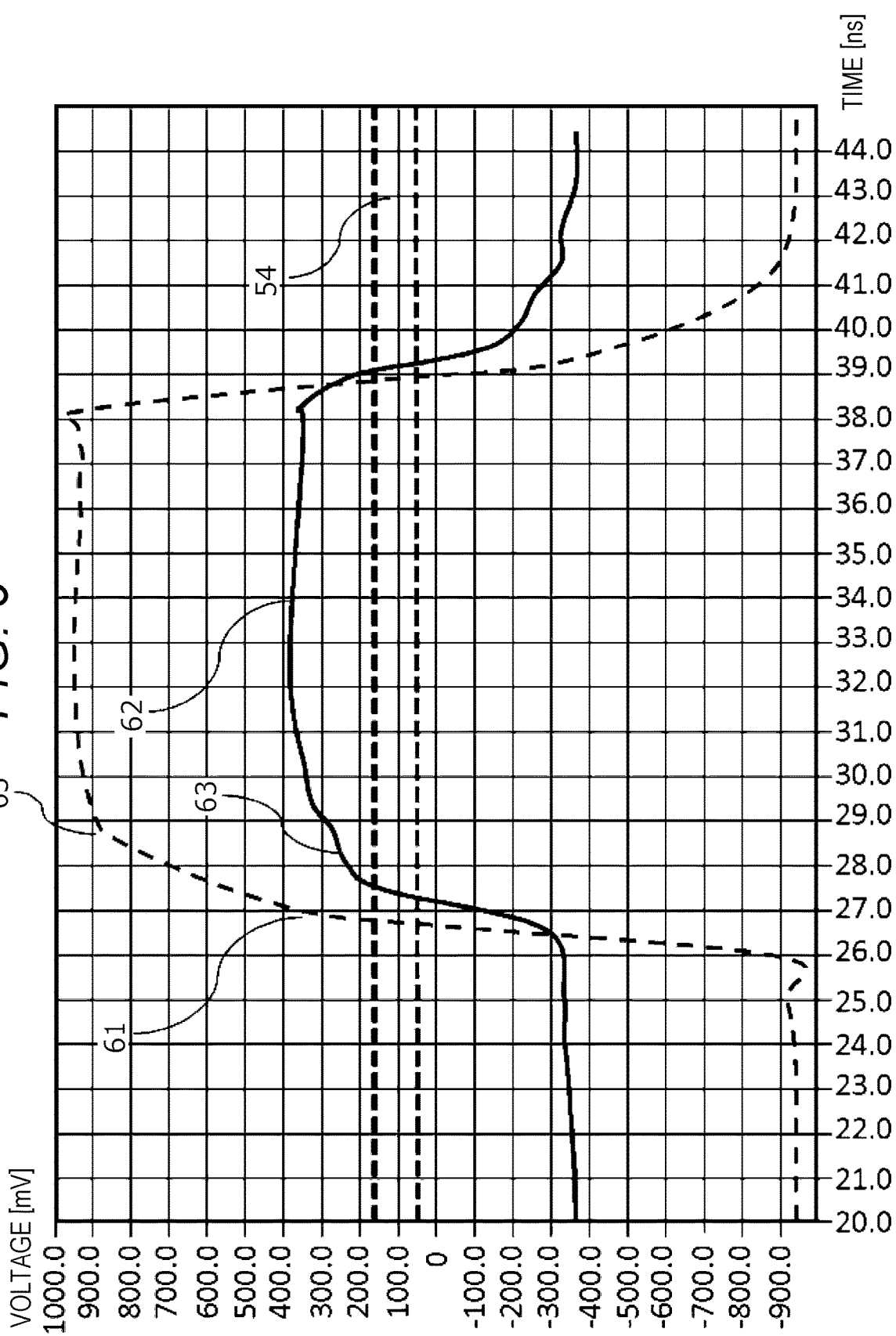
FIG. 6 is a diagram showing an example of a signal waveform in a control device according to an embodiment of the present disclosure.

FIG. 6 is a diagram showing an example of a signal waveform in the control device 100 according to the present embodiment illustrated in FIGS. 1 and 2. FIG. 6 shows a transmitted signal waveform 61 and a received signal waveform 62 in the case of transmitting a signal from the sixth daughter board 4_6 to the seventh daughter board 4_7. As shown in FIG. 6, in the present embodiment, such ringing as shown in FIG. 5 is suppressed in both the transmitted signal waveform 61 and the received signal waveform 62, and shelves 63 appear as changes in the slopes of the signals without turning back. In addition, the generated voltages of shelves 63 are positioned outside a threshold voltage range 64, and none of shelves 63 enters threshold voltage range 64.

Figure 7:
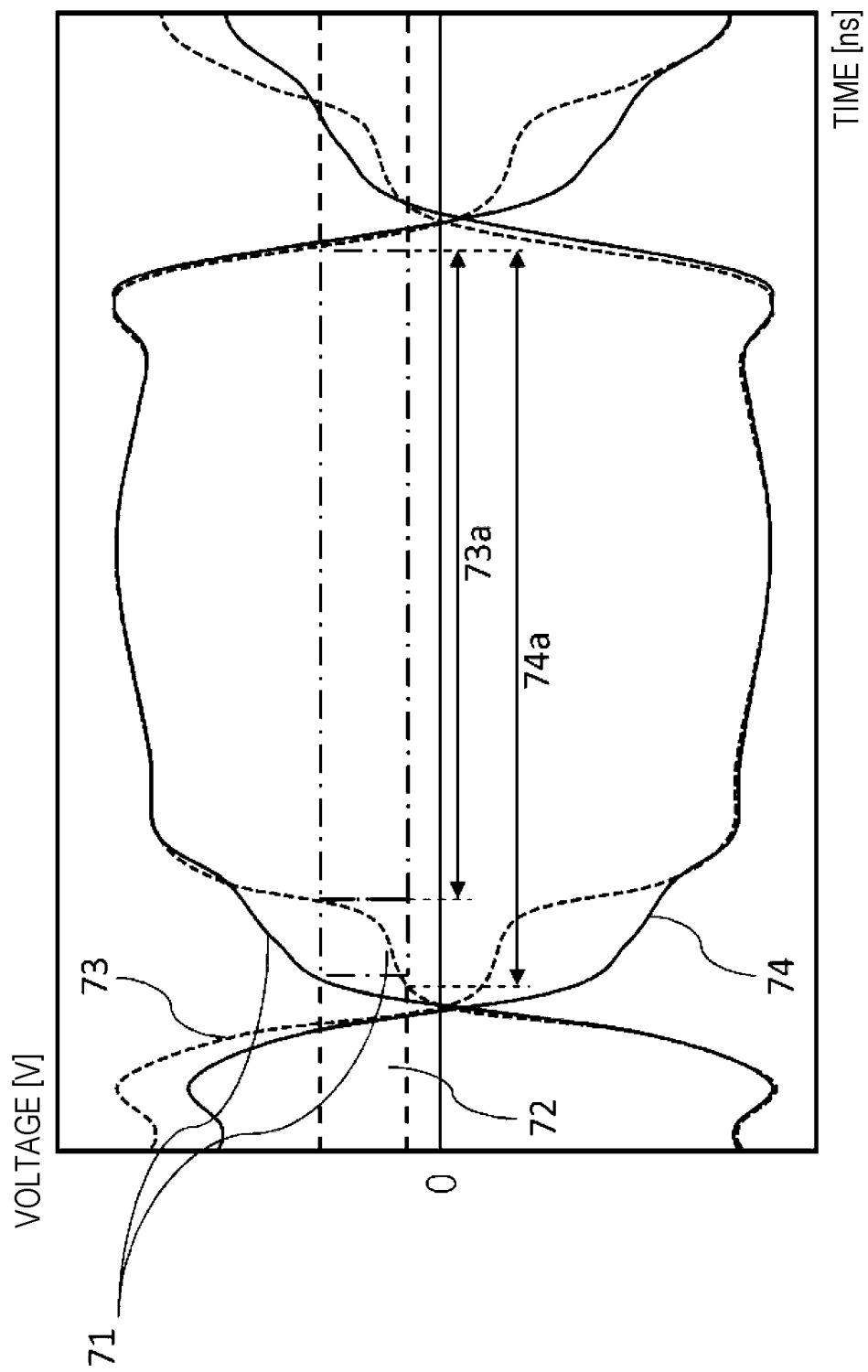
FIG. 7 is a diagram showing an example of an eye pattern in a control device according to an embodiment of the present disclosure.

FIG. 7 is a schematic diagram showing an example of an eye pattern and an eye mask in the control device 100 according to the present embodiment. FIG. 7 shows an eye pattern 73 with a shelf 71 generated inside a threshold voltage range 72 and an eye pattern 74 with a shelf 71 generated outside the threshold voltage range 72. As shown by the eye patterns 73 and 74 in FIG. 7, an eye width 74a in the case where the shelf 71 is generated outside the threshold voltage range 72 is longer than an eye width 73a in the case where the shelf 71 is generated inside threshold voltage range 72. Accordingly, the case where the shelf 71 is generated outside the threshold voltage range 72 is more advantageous in securing the timing margin of the eye mask than the case where the shelf 71 is generated inside the threshold voltage range 72.

Figure 8:
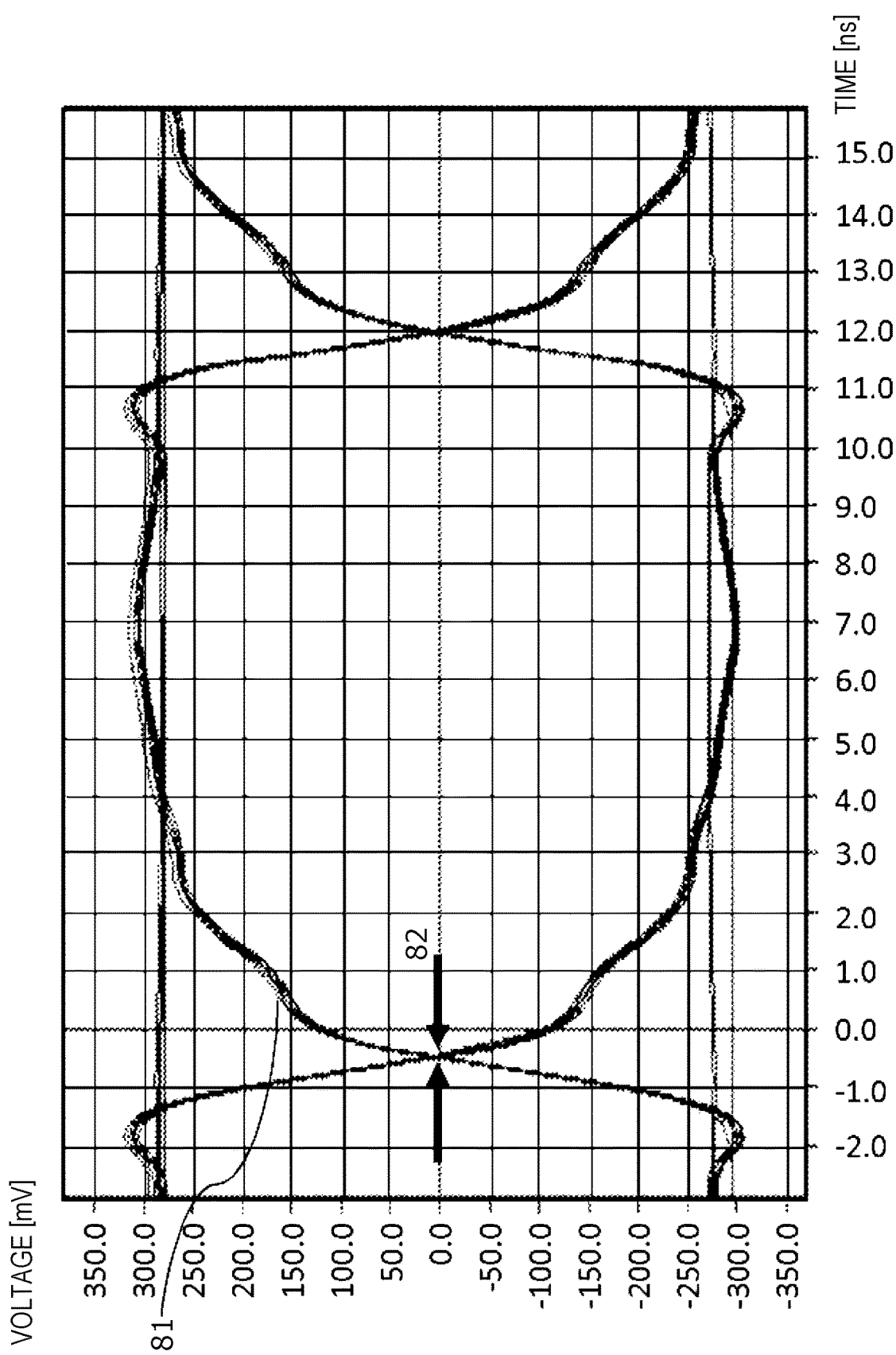
FIG. 8 is a diagram showing another example of an eye pattern in a control device according to an embodiment of the present disclosure.

FIG. 8 is a schematic diagram showing an eye pattern in the case where only the line characteristic impedance $Z_{diff}$ is 130Ω in the circuit topology illustrated in FIG. 2. As shown in FIG. 8, the generated voltage value of a shelf 81 generated in the differential signal is lower than that in the case where the line characteristic impedance $Z_{diff}$ shown in FIG. 6 is 140Ω. Thus, it is determined that, as the line characteristic impedance $Z_{diff}$ is higher, the effect of positioning the generation position of the shelf 81 outside the threshold voltage range can be obtained more.

In addition, the termination resistance value $R_{term}$ of 68Ω, which is lower than the line characteristic impedance $Z_{diff}$, reduces the range of the change in amplitude depending on the bit string of the signal, and can reduce a jitter 82 to less than 0.1 ns in both the rising waveform and the falling waveform, and keep the generated voltage value of the shelf 81 within the voltage range of about 20 mV in width.

As described above, according to the present embodiment, the main wiring 2 including the plurality of differential transmission lines 21 for transmitting differential signals is formed on the motherboard 1. The termination resistors 22, provided respectively at both ends of the plurality of differential transmission lines 21, connect the plurality of differential transmission lines 21 to each other. The plurality of daughter boards 4 are connected in parallel to each other via the main wiring 2. The line characteristic impedance $Z_{diff}$ of each differential transmission line 21 is higher than the termination resistance value $R_{term}$, which is the resistance value of the termination resistor 22. Accordingly, the daughter boards 4 are connected in parallel to each other via the main wiring 2, thus allowing hot plug of the daughter boards 4. In addition, the line characteristic impedance $Z_{diff}$ is allowed to be increased, thus allowing the generated voltage value of the shelf in the differential signal to be increased, and the shelf can be kept from being generated within the threshold voltage range. In addition, the range of the change in amplitude depending on the bit string of the signal is allowed to be reduced, thus allowing the jitter to be reduced.

Furthermore, in the present embodiment, the line characteristic impedance $Z_{diff}$ is higher than 100Ω, thus allowing the shelf to be more reliably generated outside the threshold voltage.

Furthermore, in the present embodiment, the termination resistance value $R_{term}$ is lower than 100Ω, thus allowing the jitter to be more appropriately reduced.

In addition, in the present embodiment, the damping resistor 43 is provided on the internal transmission line 42 connecting the MLVDS 41 in the daughter board 4 and the main wiring 2, and the damping resistance value $R_{dump}$ of the damping resistor 43 is lower than ½ of the line characteristic impedance $Z_{diff}$. In this case, ringing generated in the shelf is allowed to be suppressed while suppressing the generation of the shelf within the threshold voltage range.

In addition, in the present embodiment, the damping resistance value $R_{dump}$ is 33Ω or lower. In this case, ringing generated in the shelf is allowed to be more appropriately suppressed.

Furthermore, in the present embodiment, the MLVDS device 41a performs communication in accordance with the MLVDS system with the threshold voltage range from 50 mV to 150 mV. Thus, even in the case where the duty ratio of the signal is modulated, the speed is allowed to be increased.

Furthermore, in the present embodiment, the plurality of connectors 3 that allow the daughter boards 4 to be inserted and removed are provided, thus allowing hot plug for the daughter boards 4 to be easily performed.

The above-described embodiments of the present disclosure are considered as examples for describing the present disclosure, and are not intended to limit the scope of the present disclosure only to the embodiments. Those skilled in the art can practice the present disclosure in various other aspects without departing from the scope of the present disclosure.

What is claimed is:

1. A control device comprising:
a master board with a main wiring formed thereon, the main wiring including a plurality of differential transmission lines for transmitting differential signals;
termination resistors provided at both ends of each of the plurality of differential transmission lines, the termination resistors connecting the plurality of differential transmission lines to each other; and
a plurality of control boards connected in parallel to each other via the main wiring,
wherein a characteristic impedance of each differential transmission line is higher than a termination resistance value that is a resistance value of the termination resistor, and
wherein the characteristic impedance is higher than 100Ω.

2. The control device according to claim 1, wherein the termination resistance value is lower than 100Ω.

3. The control device according to claim 1, wherein
each control board includes: a communication unit that performs communication with the other control boards via the main wiring by using a differential signal; an internal wiring that connects the communication unit and the main wiring; and a damping resistor provided on the internal wiring, and
a damping resistance value, which is a resistance value of the damping resistor, is lower than ½ of the characteristic impedance.

4. The control device according to claim 3, wherein the damping resistance value is 33Ω or lower.

5. The control device according to claim 3, wherein the communication unit performs communication in accordance with a multi low voltage differential signaling (MLVDS) system with a threshold voltage range from 50 mV to 150 mV.

6. The control device according to claim 1, further comprising a plurality of connectors provided in parallel via the main wiring, the connectors configured to allow the control boards to be inserted and removed.

7. A control device comprising:
a master board with a main wiring formed thereon, the main wiring including a plurality of differential transmission lines for transmitting differential signals;
termination resistors provided at both ends of each of the plurality of differential transmission lines, the termination resistors connecting the plurality of differential transmission lines to each other; and
a plurality of control boards connected in parallel to each other via the main wiring,
wherein a characteristic impedance of each differential transmission line is higher than a termination resistance value that is a resistance value of the termination resistor,
wherein each control board includes: a communication unit that performs communication with the other control boards via the main wiring by using of a differential signal; an internal wiring that connects the communication unit and the main wiring; and a damping resistor provided on the internal wiring,
wherein a damping resistance value, which is a resistance value of the damping resistor, is lower than ½ of the characteristic impedance, and
wherein the communication unit performs communication in accordance with a multi low voltage differential signaling (MLVDS) system with a threshold voltage range from 50 mV to 150 mV.

8. The control device according to claim 7, wherein the termination resistance value is lower than 100Ω.

9. The control device according to claim 7, wherein the damping resistance value is 33Ω or lower.

10. The control device according to claim 7, further comprising a plurality of connectors provided in parallel via the main wiring, the connectors configured to allow the control boards to be inserted and removed.

* * * * *